United States Patent [19]

Chandran et al.

[11] Patent Number: 5,068,854
[45] Date of Patent: Nov. 26, 1991

[54] ERROR DETECTION FOR FIBER DISTRIBUTED INTERFACED OPTIC LINK

[75] Inventors: Srikumar R. Chandran; Franco E. Mau, both of San Jose; Steven A. Jan, Santa Clara, all of Calif.

[73] Assignee: Cupertino, California U.S.A., Calif.

[21] Appl. No.: 406,012

[22] Filed: Sep. 12, 1989

[51] Int. Cl.[5] ............................................. G06F 11/10
[52] U.S. Cl. ................................................ 371/37.1
[58] Field of Search ............... 371/37.1, 49.1, 50.1, 371/51.1

[56] References Cited

U.S. PATENT DOCUMENTS

| | | | |
|---|---|---|---|
| 3,037,697 | 6/1962 | Kahn | 371/50.1 |
| 3,718,903 | 2/1973 | Oiso et al. | 371/37.4 |
| 3,831,144 | 8/1974 | En | 371/50.1 |
| 4,371,963 | 2/1983 | Edwards, Jr. et al. | 371/51.1 |
| 4,453,251 | 6/1984 | Osman | 371/50.1 |
| 4,464,747 | 8/1984 | Groudan et al. | 371/50.1 |
| 4,811,361 | 3/1989 | Bacou et al. | 381/38.1 |

*Primary Examiner*—Charles E. Atkinson
*Attorney, Agent, or Firm*—Townsend and Townsend

[57] ABSTRACT

Error detection of digital data transmitted on an optic link is accomplished by creating, before transmission, a check code comprising check bits that correspond to spaced one of the data bits forming the plurality of bits. The check code is then transmitted with the plurality of bits to a receiver, where the plurality of bits are used to create an error code in the same manner as the check code, the error and check codes compare, and an indication of error generated when a miscompare is detected.

9 Claims, 2 Drawing Sheets

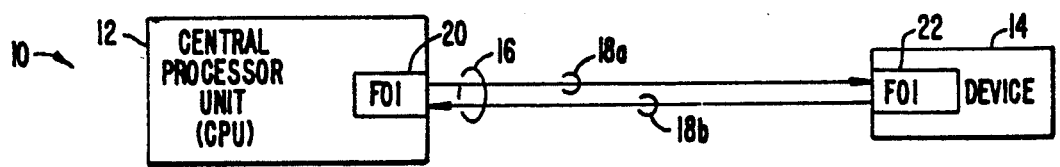
FIG._1.
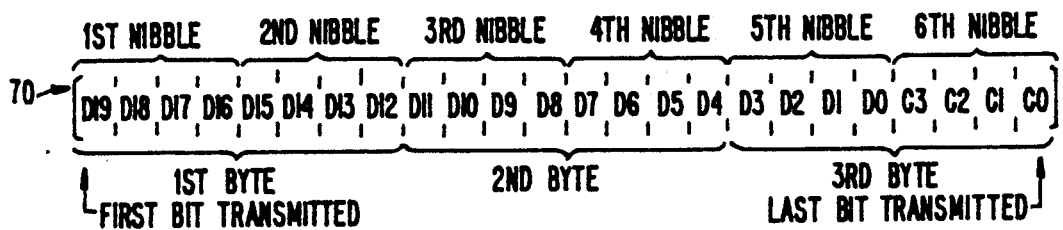
FIG._3.
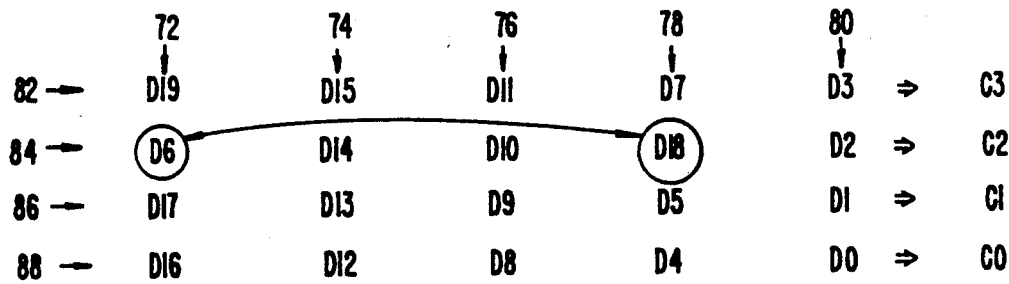
FIG._4.
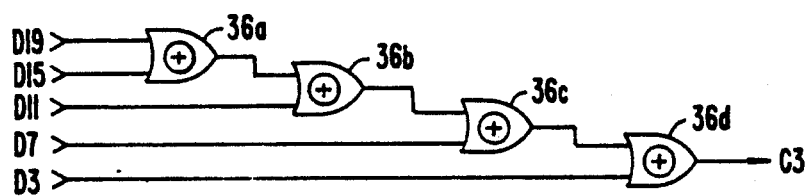
FIG._5.
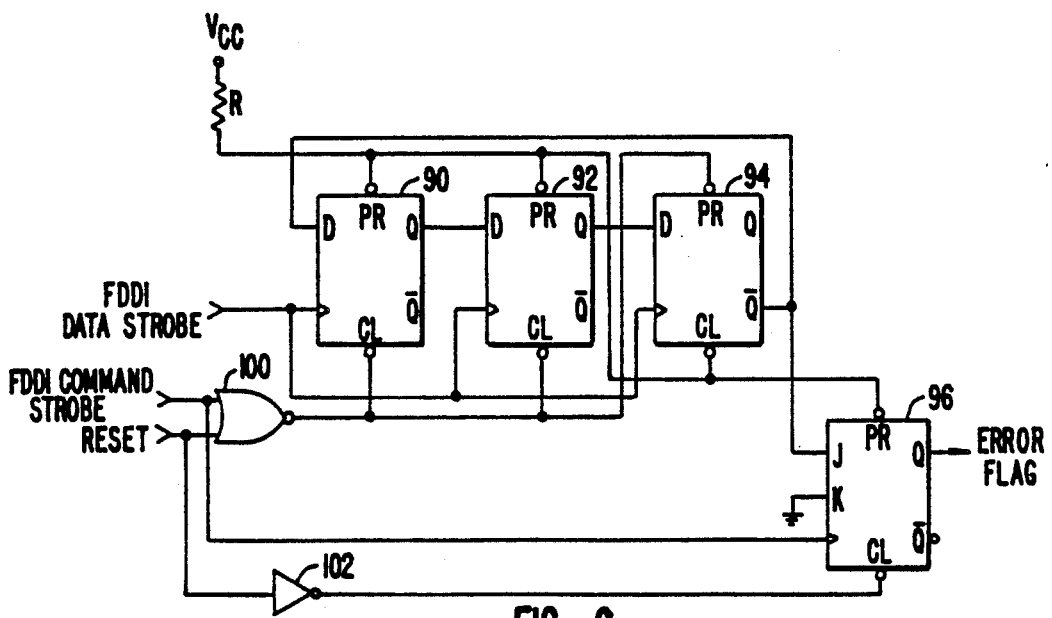
FIG._6.

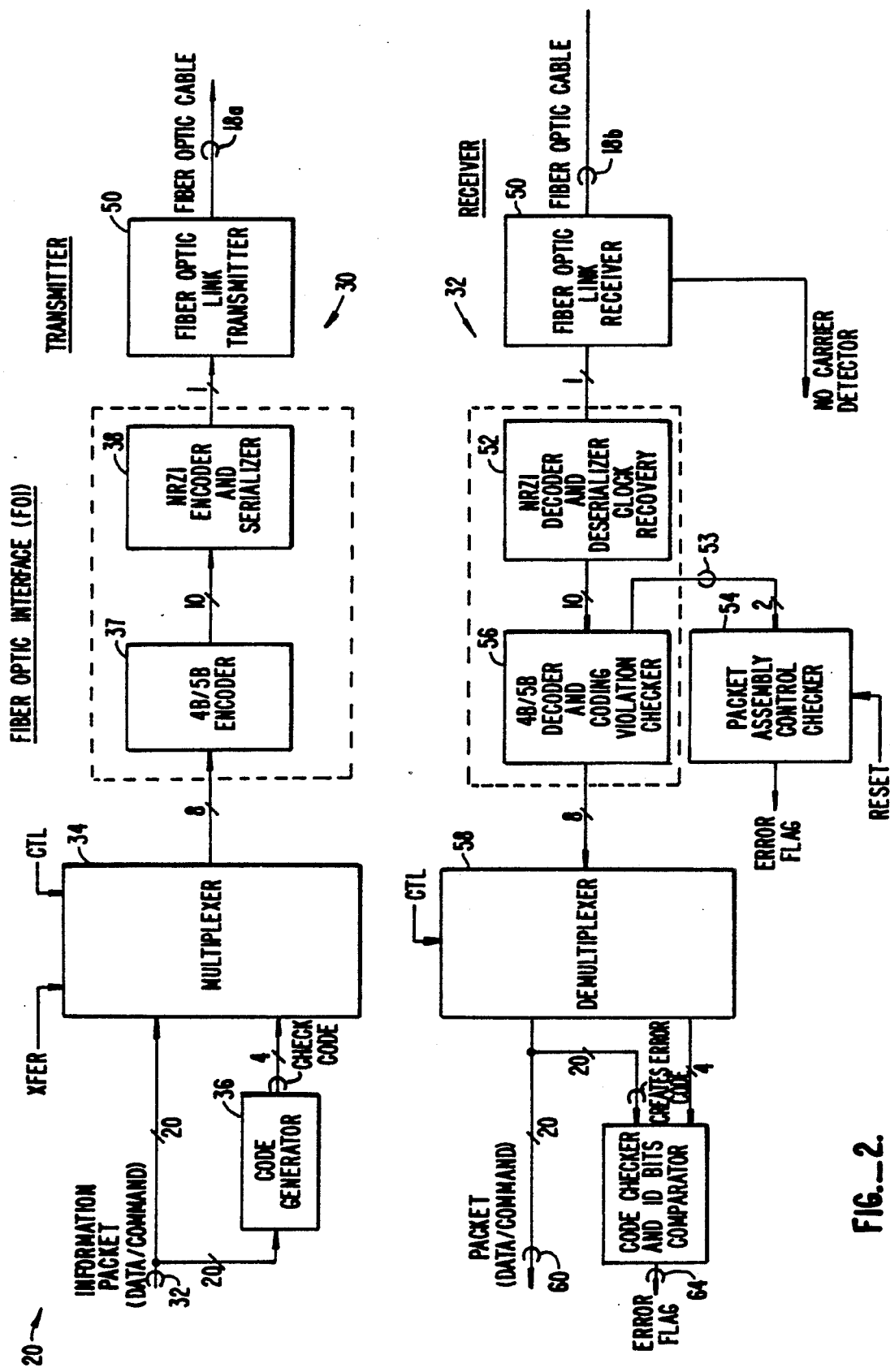
FIG._2.

ERROR DETECTION FOR FIBER DISTRIBUTED INTERFACED OPTIC LINK

BACKGROUND OF THE INVENTION

The present invention relates generally to transmission of digital data. More particularly, the invention is a method and apparatus for error detection on such serial data transmission media as fiber optic links.

Communicating connections between various components of data processing equipment, e.g., the processor system itself and such peripherals as disk drives, are until recently usually effected by one or another form of electrically conductive media, i.e., metallic wires. However, this form of communication connection is not without several problems. The physical makeup of the medium will often encounter electrical impedances of one type or another that place a limit on communication speed. And, although data transmission speed can be overcome by various techniques, such as transmitting data in parallel, other problems arise. For example, parallel data transmissions tend to create and/or exacerbate electromagnetic radiation and cross-talk problems.

These and other reasons have led to the development of various fiber optic materials for use as a data communications medium. Heretofore, data transmissions using fiber optics were little used because early fiber optic material tended to be expensive and, therefore, economically non-competitive. However, recent advances in fiber optic materials have reduced the cost to the point that fiber optics data communication can now compete realistically with conductive medium. Fiber optic material does not cause the electromagnetic radiation and cross talk problems encountered by metallic wiring. Further, fiber optic data communication provides a better bandwidth (i.e., data can be communicated faster) allows for longer length of line with less signal attenuation, and reduces cable bulk over that of conductive medium.

However, irrespective of the particular communication medium needed, it is good practice to provide some form of detecting whether the received data transmitted was, in fact, transmitted correctly. i.e., error checking. Recognizing the well-known phenomena that if anything can go wrong it will, results in use of various types of error detecting codes and techniques. Most error detection techniques use some form of "redundancy," extra bits that form an error detection code (or error correction code) for transmission along with the informational data. The extra bit or bits can be used to detect errors that may have occurred in the informational bits. The extra bit(s) are used, when the transmitted data is received, to determine if the transmission corrupted the data. The simplistic form of error checking is parity, which adds to the end of a multibit data word a ONE or ZERO depending upon whether the number of ONEs of the data word is even or odd.

While the various error-checking techniques—including parity checking—provide a modicum of confidence that received data is error free, as opposed to no error checking at all, multiple errors, or adjacent bit errors, may miss detection. To overcome these particular problems, more elaborate error checking (or correction) techniques are used, such as CRC check-sum methods, or Fire code encoding. However, these techniques can (and usually do—to be effective) add a significant number of data bits to the transmitted information. The addition of extra bits to the transmitted information degrades the total bandwidth for information transmission.

SUMMARY OF THE INVENTION

Therefore, the present invention provides an error checking technique that uses a minimum number of extra bits (hereinafter, "check code" bits) that attach to the information bits covered by the error check. Adjacent bit masking is minimized by the manner in which the check code is created.

According to the method of the present invention, a packet of information bits (which could be data or command or both) is conceptually divided into a plurality of data bit groups. Predetermined corresponding bits from each of the data bit groups are associated with one another to create a check code for each such association of bits. The information packet is transmitted serially, immediately followed by the check code. At the receiving end, an error code is developed from the information packet in the same manner as the check code is created. The error and check code are then compared to one another, and an error signal generated if a mismatch is detected, indicating that an error may have occurred during transmission.

In the preferred embodiment of the invention, the information packet is twenty bits in length. Each 4-bit nibble contributes a bit that is combined with correspondingly located bits of each other nibble to form a parity bit. The four parity bits so created form the check code for that information packet.

In an alternate embodiment of the invention, the 20-bit information packet includes two adjacent identification (ID) bits that identify the packet as containing either data or command information. Corruption of these two bits, during transmission that could cause erroneous interpretation of the content of the received packet. To minimize this potential problem, one of the two bits is swapped with another of the bits in the information packet before serial transmission thereof.

Several advantages of the present invention should now be evident to those skilled in this art. One particular is that the error checking method of the present invention, for fiber optic serial transmission of information, uses a minimum-sized check code. Thereby, information transmission bandwidth is not significantly affected, as it would be if the check code size was larger.

Yet another advantage of the present invention is that the error detecting codes that cover the transmitted information are spatially removed from the information they cover. This advantage enhances the capability of detecting transmission errors.

These and other advantages and aspects of the present invention will become evidence to those skilled in the art upon a reading of the following detailed description of the preferred embodiment of the invention, which should be taken with the accompanying drawings.

BRIEF DESCRIPTION OF THE DRAWINGS

FIG. 1 is a simplified block diagram illustrating use of the present invention in a data processing system comprising at least a processor unit and an associated peripheral device;

FIG. 2 is a more detailed block diagram of the data transmission apparatus incorporating the error checking method of the present invention;

FIG. 3 is a diagrammatic representation of the information and error checking code transmitted by the apparatus of FIG. 2;

FIG. 4 is an illustration of the method used to create the check code used for detecting errors occurring in transmission of data; and FIG. 5 is an illustration of a portion of the circuit used to create one bit of the check coded illustrated in FIG. 4.

DETAILED DESCRIPTION OF THE INVENTION

Referring now to the figures, and with specific reference to FIG. 1, a data processing system 10 is illustrated, including a central processor unit (CPU) 12 and a peripheral device 14, such as a disk drive storage unit. The device 14 couples to the CPU 12 by a communication link 16. In the preferred embodiment of the invention, communication between the CPU 12 and the device 14 is full duplex. This provides simultaneous data transmission both ways between the CPU 12 and device 14, using fiber optic media. Accordingly, the communication link 16 includes a pair of fiber optic cables 18a and 18b for respectively communicating data from and to the CPU 12, to and from the device 14.

In addition, the communication of information between the CPU 12 and the device 14 preferably uses the physical standard described by ANSI standard X3T9.5, generally known as the Fiber Distributed Data Interface (FDDI). As noted, only the physical standard is used, and not the protocols described by the FDDI standard.

The CPU 12 and device 14 each respectively includes a fiber optic interface (FOI) 20, 22 that connects the communication link 16 to the other. Each FOI 20, 22 operates to translate electrical signals to light signals when transmitting data, or to translate light signals to electrical signals when receiving data, via the communication link.

Referring now to FIG. 2, the FOI 20 of the CPU 18 is illustrated in greater detail. The FOI 22 of the device 14 is of substantially identical design and, therefore, a description of the FOI 20 will be recognized as also being a description of the FOI 22.

As FIG. 2 illustrates, the FOI 20 comprises a transmitter section 30 and a receiver section 32. Information packets of 20-bits, each containing either data or command information (but not both), are applied to a 20-bit input bus 32 of the transmitter section 30. The input bus 32 communicates the information packet to a multiplexer 34 and a code generator 36. The code generator 36 is a combinatorial logic circuit that creates from the 20 bits applied thereto a 4-bit check code. The output of the code generator 36 communicates the check code to the multiplexer 34.

The multiplexer 34 operates to multiplex the 24 bits of received data to three, one-byte (8 bit) segments that are coupled to a 4B/5B encoder 37. The 4B/5B encoder 37 encodes each 4-bit nibble of the received byte into 5 bits, according to the FDDI standard mentioned above, producing for each byte received a 10-bit data word.

Each such 10-bit data word is communicated to a non-returned-to-zero inverse (NRZI) encoder and serializer that, in effect, operates to convert the received data from parallel to serial form, and then to convert it to the well known NRZI analog encoding (in which polarity transitions represent a logical ONE, and the absence of a polarity transition denotes a logical ZERO). From the NRZI encoder and serializer, each encoded 10-bit data word is communicated to a fiber optic link transmitter 40, converted to light in conventional fashion, and applied to the fiber optics cable 18a.

At the other end of the fiber optic cable 18a is a receiver substantially in the form of the receiver 32. The communicated light is received at a fiber optic link receiver 50 through a conventional arrangement of optic detection, converting the received light to electrical energy. The output of the fiber optic link receiver 50 is communicated to a NRZI decoder and deserializer 52. The NRZI decoder recovers clock and data signals from the received information.

The NRZI decoder 52 additionally operates to deserialize the received analog information to 10-bit digital data words. Sequentially applied to a 4B/5B decoder 56, each contiguous 5-bit groups of the data words are converted back to their original 4-bit configuration, and assembled as an 8-bit byte. The 4B/5B decoder 56 also checks to determine the type of information in the received packet (i.e., whether FDDI data or command), and signals the type to a packet assembly control checker 54 via signal lines 53. As noted above, three 8-bit bytes form each data packet. Thus, the packet assembly control checker determines whether, indeed, in any sequence of transmitted packets, all were entirely received, as will be described more fully below.

Each 8-bit byte is then communicated from the 4B/5B decoder 56 to a demultiplexer 58 where each 3 bytes received are assembled as a 20-bit data/command packet with 4 bits of check code. The 20-bit packet is applied to an output bus, and to a code checker and ID comparator 62. The code checker and ID comparator 62 performs three functions: First, it creates a 4-bit error code from the received 20-bit packet in the same manner as the check code by the code generator 36 (transmitter section 30). Second, the code checker 62 compares the error code so created with the received 4-bit check code. A favorable compare will provide a substantial confidence that the information transmitted by the transmitter 30 was correctly received by the receiver 32. A mismatch, however, will indicate the possibility that the transmitted data was incorrectly received, and an error flag signal 64 will be asserted by the code checker 62. Third, the code checker reads the two ID bits that identify whether the information contained in the packet is data or command information. These ID bits can take on one of four states. However, only two of those states are valid. Accordingly, if the 2 ID bits assume an invalid statement, the code checker 62 also will assert the error flag signal 64.

Illustrated in FIG. 3 is a diagrammatic representation of a typical 20-bit information packet, together with the check code generated from that packet by the code generator 36. As FIG. 3 illustrates, the transmitted output of the multiplexer supplies the 20-bit information packet, comprising bits D0–D19, and the four bits of check code, bits C0–C3. Bit D19 is the most significant bit (MSB), and bit C0 forms the least significant bit (LSB). This 24-bit packet, after being encoded 4 bits to 5 bits (according to the FDDI standard mentioned above) is transmitted MSB first.

As noted above, two bits of the 20-bit information packet are used to identify whether the information contained in the packet is data or command. These two bits are bits D19 and D18. If bits D19, D18 are a "00," the information packet contains command information; conversely, if these bits are a "11," the information packet contains data information. If the bits D19, D18 are a "01" or "10" it is assumed that a transmission error has occurred because these are invalid states for these data bits.

Considering that it is not uncommon for adjacent bits to incur similar errors, and as an additional fault protection technique, one of the data bits D19, D18 is swapped with one of the other bits of the information packet. Thus, the data bit D6 is swapped with the data bit D18 in the multiplexer 34. This is done merely by auspicious wiring connections in the circuit used to form the code multiplexer 34. The swapped bits are returned to their normal locations in the packet by the demultiplexer 58.

Referring now to FIG. 4, illustrated therein is the manner in which the check code is generated by the generator 36. The bits of the 20-bit information packet that are received by the code generator 36 are conceptually grouped as 4-bit nibbles 72, ..., 80. After the swap of the data bits D18 and D6, bits of corresponding bit positions (82, ..., 88) of each sequential 4-bit nibble 72, ..., 80 are associated for generating a parity bit that, together with the other parity bits of the other associated, corresponding bits, form the 4-bit check code. Thus, for example, the data bits D19, D15, D11, D7 and D3 in bit positions 82 are used to create a parity bit that forms the check bit C3. Even parity is used.

In similar fashion, a parity bit generation over the data bits D18 (which is swapped position in the packet with data bit D6 as described above), D14, D10, D6, and D2 develops the check bit C2. The remaining data bits are used in similar fashion to generate the check code bits C1 and C0.

As indicated, the transmitter section 30 receives data in the form of 20 bit information packets. Those 20 bits are used to create the check code comprising check code C0–C3 (FIG. 3) in the following manner: Conceptually, each of the 4-bit "nibbles" of the information packet 70 are arranged in the columns 72,-80, as illustrated in FIG. 4. So arranged (with the data bits D6 and D18 of the information packet swapped, as described above, and indicated in FIG. 4), the data bits of the packet 70 form four rows 82–88. Thus, for example, the row 82 contains corresponding data bits from each of the five nibbles of the information packet 70, i.e. data bits D19, D15, D11, D7, and D3. A parity bit (preferably, even parity) is generated for the data bits of each of the rows 82–88 that respectively become the check code bits C3–C0 of the check code.

The parity generation uses conventional combinatorial logic techniques carry out an exclusive-oring of each data bit with the corresponding other data bits in the row (e.g., row 82). For example, FIG. 5 illustrates a portion of the combinatorial logic that makes up the code generator 36 (FIG. 1) for generating parity (i.e., the check code bit C3) from the data bits D19, D15, D11, D7, and D3 of the informational packet 70. The circuitry that develops the check code bits C2, C1 and C0 is substantially identical (except for the swap of bits D18, D6, referred to above). As FIG. 5 illustrates, EXCLUSIVE-OR gates 36a, 36b, 36c, and 36d form that section of the code generator 36 that creates the check code bit C3 from bits D19, D15, D11, D7, D3.

Turning now to FIG. 6, the packet assembly control checker 54 (FIG. 1) is illustrated in greater detail. As shown, the packet assembly control checker 54 includes three D-type flip-flops 90, 92, and 94 arranged in a shift register configuration to receive, at the clock input of each, a FDDI data strobe signal from the 4B/5B decoder 56 of the receiver 32 (FIG. 1). Connected to the preset (PR) inputs of the flip-flops 90, 92 and the clear (CL) input of the flip-flop 94, by a resistance R, is a positive voltage source $V_{cc}$.

The packet assembly control checker 54 also includes a J/K flip-flop 96, whose preset (PR) input is also connected to the $V_{cc}$ trough the resistor R. As will be seen, the J/K flip flop 96 functions to latch and hold an error signal, producing therefrom an error flag indicative thereof.

The operation of the packet assembly control checker 54 is based on the requirement that there be transmitted three (10-bit) data words for every packet. As the serial information is received and converted from (NRZI) analog to digital form by the NRZI decoder 52, it is reassembled into the FDDI encoded 10-bit data words. Each reassembled data word is applied to the 4B/5B decoder 56. The decoder 56 asserts the FDDI data strobe signal (communicated on one of the two strobe lines 53) for each received data word.

Digressing a moment, when the transmitter section 30 of the FOI 20 is not sending information packets, it is autonomously sending sync bytes at a regular rate (the same rate as data transmission). This ensures that the clock of the receiver section 32 remains in synchronization. Each received sync byte is detected as such by the 4B/5B decoder 56, and the FDDI command strobe signal is asserted and communicated on the other of the two signal lines 53 to the packet assembly control checker 54. The sync byte is not forwarded to the demultiplexer 58.

The packet assembly control checker 54 receives these two FDDI strobes (data and command), and the FDDI data strobe is, in effect, counted by the shift register arrangement 90, 92 and 94 as follows:

Assume that no packets have been transmitted, resulting in transmission of one or more sync bytes by the transmitter section of one of the FOIs 20,22, and received by the receiver section 32 of the other. The decoder 56 of the receiver section 32 has issued, for each received sync byte, a FDDI command strobe, which is coupled via the NOR gate 100 to preset the flip-flop 94. As a result, the D input of the flip-flop 90 receives a logic ONE asserted by the Q output of the flip flop 94: the D inputs of the flip-flops 92 and 94 receive logic ZERO's.

Assume now that the receiver 32 begins receiving transmitted packets. The FDDI data strobe is asserted for each data word of the received packets. The first occurrence of the FDDI data strobe will cause the flip-flop 90 to be set to a ONE, while the flip-flop 94 is set to a ZERO (flip-flop 92 remains a ZERO). The second occurrence of FDDI data strobe will cause the flip-flop 92 to be set to a ONE, while flip flop 94 remains ZERO and flip flop 90 is reset to ZERO. As can be seen, the third FDDI data strobe will reset the flip-flop 92 to a ZERO, and set the flip-flop 94 to a ONE. In effect, a logic ONE has been shifted into, and through the flip-flop chain 90, 92, 94. As a result of this shift operation, the Q output of the flip-flop 94 is set to a logic ONE, and the Q output is set to a logic ZERO. With the Q output applied to the J input of the J/K flip flop 96, clocking of this flip-flop is inhibited for reasons that will be made clear below. This process continues for each packet received, until all packets have been sent. Termination of communication of packets will result in transmission of sync bytes until another packet is sent. Thus, after receipt of three, or any multiple of three, data words, the J input of the J/K flip-flop 96 will have a logic ZERO applied its J input. Receipt of an FDDI command strobe signal at the clock of the flip flop 96 will be ignored, and the Q output of the flip flop 96 will remain at ZERO.

However, if at any time the FDDI command strobe is asserted (i.e., a logic ONE) at the J input of the J/K, indicating that something other than three, or a multiple of three data words was not received before a sync byte, the Q output of the J/K flip-flop 96 will be set to a ONE, asserting (and latching) the ERROR FLAG. Setting the ERROR FLAG indicates the possibility of loss of a packet in transmission upstream of the 4B/5B/ decoder 56 thereby providing a form of fault isolation.

A system RESET command can be generated to reset the packet assembly control checker 54 via the OR gate 100 (to the flip flop 90-94) and the INVERTOR 102 (for flip flop 96).

The transmitter, receiver pair (30,32) that forms the fiber optic interface may be constructed from commercially available, off-the-shelf elements. For example, the 4B/5B encoder 36 and NRZI encoder 38 of the receiver 30, and the 4B/5B decoder 56 and NRZI decoder 52, are separately sold as single integrated circuit packaged devices by Advanced Micro Devices, 901 Thompson Place. Sunnyvale, California 94088 under the part numbers AM7968 and AM7969, respectively. These devices are constructed to generate, autonomously, the sync byte described above when not transmitting packets.

Similarly, the fiber optic link transmitter 50 and fiber optic link receiver 52 are conventional electro-optic devices constructed to convert electrical energy to light energy, or back.

The multiplexer 34 and demultiplexer 56 are of conventional design. They are each constructed and configured, for example, to include a state machine (not shown) that controls a conventional multiplex, demultiplex circuit to perform the operations required of the multiplexer 34, 56, respectively. The system provides a clock (CLK) signal for synchronous operation thereof, and a control (CTL) signal to various control functions that may need such signals.

What is claimed is:

1. A method for checking for the occurrence of errors in digital data packet containing N serially transmitted bits, the N bits including two adjacent bits indicative of one of a plurality of forms of the N bits, comprising the steps of:
    swapping one of the two bits with one of the remaining N bits;
    creating a check code having at least one bit derived from N/M bits occupying corresponding bit positions of N/M equal-bit groups of the N bits;
    serially transmitting the N bits together with the check code;
    receiving the N bits and check code, and creating from the received N bits an error code in the same manner as the check code was created;
    comparing the error and check codes to provide a indication of error when the error and check codes do not match.

2. The method of claim 1, wherein the check code created is a plurality of parity bits, each parity bit being calculated over the N/M bits occupying corresponding bit positions.

3. The method of claim 1, wherein the check code is transmitted following transmission of the plurality of bits.

4. In a data communication system for communicating N-bit packets of digital data, including at least two bits indicative of one of a plurality of data types, apparatus to detect the presence of data corruption that may occur during transmission, the apparatus comprising:
    first circuit means for swapping a one of the two bits with a one of the remaining N bits, and including encoding means for creating a check code that is derived from N/M bits that occupy corresponding bit positions of N/M groups of the N bits;
    transmitting means coupled to the first circuit means for receiving and serially transmitting the N bits and the check code in a FDDI 4B/5B format;
    receiving means coupled to receive the 4B/5B encoded N bits and check code, including means to extract the N bits and the check code from the FDDI 4B/5B format, and means for creating from the received N bits an error code in the same manner as the check code was created; and
    second circuit means comparing the error and the check codes to provide an indication of error when the error and check codes do not match.

5. The apparatus of claim 4, wherein N=20.

6. The apparatus of claim 5, wherein M=5.

7. The apparatus of claim 4, wherein the transmitting means includes means for transmitting the FDDI 4B/5B encoded N bits and check code as a number of individual data words.

8. The apparatus of claim 5, wherein the receiving means includes means for returning the swapped bits to their original locations in the N bit packet prior to creating the error code.

9. In a data communication system for communicating N-bit packets of digital data, including at least two bits indicative of one of a plurality of data types, a method of detecting the presence of data corruption which may occur during transmission, the method comprising the steps of:
    swapping of one of the two bits with a one of the remaining N bits;
    creating a check code that is derived from N/M bits that occupy corresponding bit positions of N/M groups of the N bits;
    serially transmitting the N bits and the check code in a FDDI 4b/5b format;
    receiving the 4B/5B encoded N bits and check code, and extracting the N bits and the check code from the FDDI 4B/5B format;
    creating from the received N bits an error code in the same manner as the check code created; and
    comparing the error and the check codes to provide an indication of error when the error and check codes do not match.

* * * * *